(12) United States Patent
Kim (10) Patent No.: US 9,350,332 B1
(45) Date of Patent: May 24, 2016

(54) SEMICONDUCTOR DEVICE INCLUDING RETENTION CIRCUIT

(71) Applicant: SK hynix Inc., Gyeonggi-do (KR)

(72) Inventor: Jungug Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/619,926

(22) Filed: Feb. 11, 2015

(51) Int. Cl.
*G05F 1/10* (2006.01)
*G05F 3/02* (2006.01)
*H03K 3/037* (2006.01)
*H03K 19/00* (2006.01)

(52) U.S. Cl.
CPC .......... *H03K 3/0375* (2013.01); *H03K 19/0008* (2013.01)

(58) Field of Classification Search
USPC .................................................. 327/530–546
See application file for complete search history.

(56) References Cited

U.S. PATENT DOCUMENTS

| | | | | |
|---|---|---|---|---|
| 6,535,056 B2 * | 3/2003 | Mizuno | ...................... | G06F 1/32 327/544 |
| 7,272,068 B2 * | 9/2007 | Yamaoka | ................ | G11C 5/146 365/154 |
| 7,492,192 B2 * | 2/2009 | Kumata | ................. | G06F 9/3869 326/93 |
| 7,590,908 B2 * | 9/2009 | Ishimura | ........ | G01R 31/318575 713/320 |
| 7,649,405 B2 * | 1/2010 | Wang | .................. | H03K 19/0016 326/34 |
| 7,908,499 B2 * | 3/2011 | Ito | .......................... | G06F 1/3203 327/211 |
| 7,948,263 B2 * | 5/2011 | Kim | ................... | H03K 19/0016 326/112 |
| 8,022,753 B2 * | 9/2011 | Ikeda | .................... | G06F 1/3203 327/544 |
| 8,406,075 B2 * | 3/2013 | Lee | ......................... | G11C 5/063 365/226 |
| 2009/0164860 A1 * | 6/2009 | Ishimura | ........ | G01R 31/318575 714/731 |
| 2014/0266401 A1 * | 9/2014 | Park | ....................... | H03K 3/012 327/434 |

FOREIGN PATENT DOCUMENTS

KR 1020100069608 6/2010
KR 1020100103195 9/2010

* cited by examiner

*Primary Examiner* — Brandon S Cole
(74) *Attorney, Agent, or Firm* — IP & T Group LLP (57) ABSTRACT

A semiconductor device includes first power lines through which first power is supplied, a plurality of unit regions defined by the first power lines, and second power lines through which second power is supplied. Each of the unit regions includes a logic circuit suitable for operating by receiving the first power from at least one of the first power lines during a normal mode, and a retention circuit suitable for operating by receiving the second power from at least one of the second power lines, receiving data from the logic circuit when an operation mode changes from the normal mode to a sleep mode, and keeping the data during the sleep mode. The logic circuit is electrically separated from the second power lines.

17 Claims, 7 Drawing Sheets

SEMICONDUCTOR DEVICE INCLUDING RETENTION CIRCUIT

BACKGROUND

1. Field of Invention

Various embodiments of the present invention relate to an electronic device, and more specifically, to a semiconductor device including a retention circuit.

2. Description of Related Art

In integrated circuits, it is a significant task to reduce power consumption, and a number of methods of reducing power consumption have been introduced.

In order to reduce power consumption, integrated circuits may operate in a sleep mode. For example, when an integrated circuit is not used for a certain period of time, the integrated circuit may detect it and supply power only to some elements, to reduce power consumption. When an integrated circuit is mounted in a portable apparatus, the reduction of power consumption may significantly affect of the overall power consumption of the portable apparatus.

For an integrated circuit to support a sleep mode, a circuit for retaining data that was being used in normal mode may be required so the data is not lost.

SUMMARY

Various embodiments of the present invention are directed to a semiconductor device with reduced power consumption.

According to an aspect of the present invention, there is provided a semiconductor device including first power lines through which first power is supplied, a plurality of unit regions defined by the first power lines, and second power lines through which second power is supplied. Each of the unit regions includes a logic circuit suitable for operating by receiving the first power from at least one of the first power lines during a normal mode, and a retention circuit suitable for operating by receiving the second power from at least one of the second power lines during a normal mode, receiving data from the logic circuit when an operation mode changes from the normal mode to a sleep mode, and keeping the data during the sleep mode. Here, the logic circuit is electrically separated from the second power lines.

In some embodiments, the unit regions are defined in a grid by the first power lines, In some embodiments, the first power may be blocked and the second power may be supplied to the unit regions during the sleep mode. The second power may be supplied to the retention circuit during the normal mode and the sleep mode.

In other embodiments, the retention circuit may be provided in an area separated from an area in which the logic circuit is provided, in a corresponding unit region.

In still other embodiments, the retention circuit includes a storage unit suitable for storing the data during the sleep mode.

In still other embodiments, the retention circuit may include a plurality of retention flip-flops suitable for storing the data during the sleep mode.

In still other embodiments, the logic circuit may include a plurality of logics and normal flip-flops using the first power, and the retention circuit may include a plurality of retention flip-flops using the second power. The retention flip-flops may receive data latched in the normal flip-flops when an operation mode changes from the normal mode to the sleep mode and keep the data.

In still other embodiments, the normal flip-flops and the retention flip-flops may form a scan chain.

In still other embodiments, the semiconductor device may further include a clock generation block suitable for generating first and second clocks.

In still other embodiments, a logic circuit in a first unit region among the unit regions may include first logics and first normal flip-flops suitable for operating in synchronization with the first clock. Here, a retention circuit in the first unit region may include first retention flip-flops suitable for receiving data from the first normal flip-flops in synchronization with the first clock when an operation mode changes from the normal mode to the sleep mode and keeping the data received from the first normal flip-flops.

In still other embodiments, the first normal flip-flops and the first retention flip-flops may form a scan chain.

In still other embodiments, a logic circuit in a second unit region among the unit regions may include second logics and second normal flip-flops suitable for operating in synchronization with the first clock, and third logics and third normal flip-flops suitable for operating in synchronization with the second clock. Here, a retention circuit in the second unit region may include second retention flip-flops suitable for receiving data from the second normal flip-flops in synchronization with the first clock when an operation mode changes from the normal mode to the sleep mode and keeping the data received from the second normal flip-flops, and third retention flip-flops suitable for receiving data from the third normal flip-flops in synchronization with the second clock when an operation mode changes from the normal mode to the sleep mode and keeping the data received from the third normal flip-flops.

In still other embodiments, the second normal flip-flops and the second retention flip-flops form a first scan chain, and the third normal flip-flops and the third retention flip-flops may form a second scan chain.

In still other embodiments, the first unit region may include a first demultiplexer suitable for receiving the data from the logic circuit in the first unit region, transmitting the received data to a second logic circuit included in a second unit region among the unit regions during the normal mode, and transmitting the received data to the first retention circuit during the sleep mode.

BRIEF DESCRIPTION OF THE DRAWINGS

The above and other objects, features, and advantages of the present invention will become more apparent to those of ordinary skill in the art by describing in detail exemplary embodiments thereof with reference to the accompanying drawings, in which.

DETAILED DESCRIPTION

Exemplary embodiments of the present invention will be described in detail below with reference to the accompanying drawings. The embodiments of the present invention may, however, be modified in different forms and should not be construed as limited to the embodiments set forth herein. Rather, these embodiments are provided so that this disclosure is thorough and complete and fully conveys the inventive concept to those skilled in the art, and the inventive concept is only defined by the scope of the appended claims.

It will be understood that when an element or layer is referred to as being "connected to" or "coupled to" another element or layer, it can be connected or coupled to the other element or layer or intervening elements or layers may be present. It will be further understood that the terms "comprises," "comprising," "includes," and/or "including," when used herein, specify the presence of stated components, but do not preclude the presence or addition of one or more other components.

Figure 1:
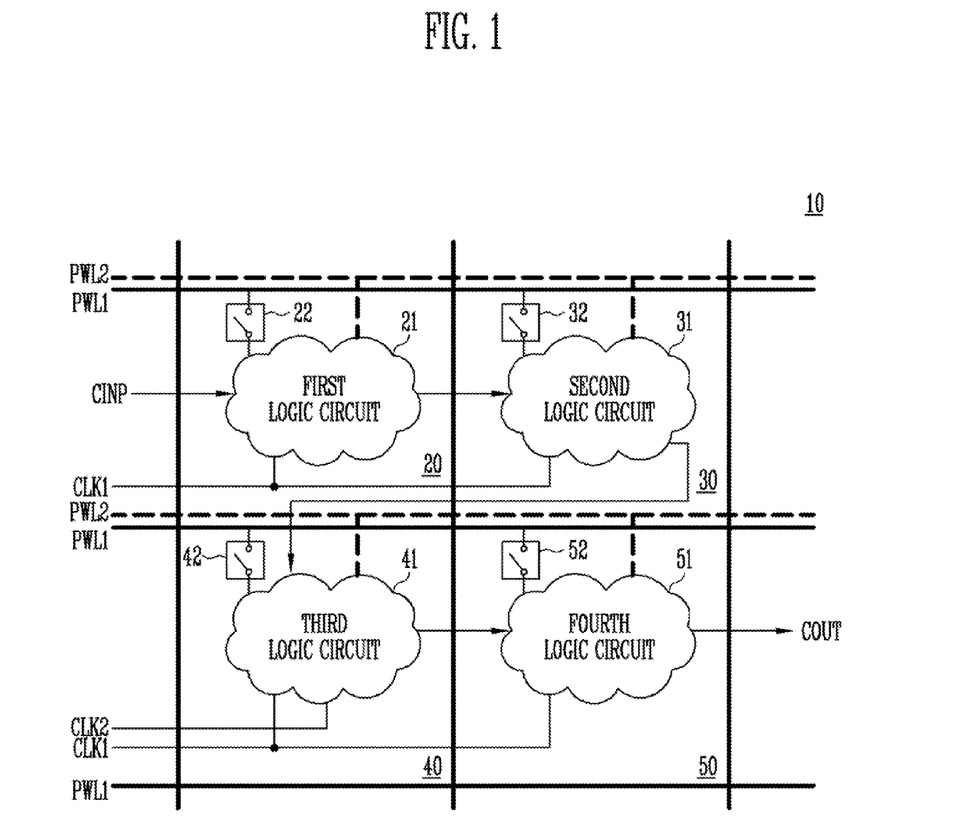
FIG. 1 is a diagram showing a function block included in a semiconductor device.

FIG. 1 is a diagram showing a function block 10 included in a semiconductor device.

The function block 10 includes first power lines PWL1 and second power lines PWL2. For convenience, the first power lines PWL1 are shown in thick solid lines, and the second power lines PWL2 are shown in thick broken lines. First power is supplied through the first power lines PWL1, and second power is supplied through the second power lines PWL2.

In a normal mode, the first power is supplied through the first power lines PWL1. In a sleep mode, the first power is blocked. In the normal mode and the sleep mode, the second power is provided through the second power lines PWL2.

The first power lines PWL1 define a plurality of grid regions (or unit regions) 20 to 50. First to fourth grid regions 20 to 50 include first to fourth logic circuits 21 to 51, respectively. Each of the first to fourth logic circuits 21 to 51 receives the first and second power from the first power lines PWL1 and the second power lines PWL2, respectively.

The function block 10 receives a chip input signal CIN and generates a chip output signal COUT in response to the input signal CIN, by an operation of the first to fourth logic circuits 21 to 51. Each of the first to fourth logic circuits 21 to 51 may perform a logic operation on an input to provide an output. Each of the first to fourth logic circuits 21 to 51 may receive clocks for its own operation. In FIG. 1, the first, second, and fourth logic circuits 21, 31, and 51 operate in synchronization with a first clock CLK1. The third logic circuit 41 operates in synchronization with the first clock CLK1 and a second clock CLK2.

In the normal mode, the first to fourth logic circuits 21 to 51 may receive the first power through the first power lines PWL1 to operate. In the sleep mode, the first to fourth logic circuits 21 to 51 may not receive the first power. Accordingly, the function block 10 may consume less power in the sleep mode. First to fourth switches 22 to 52 may be controlled to be turned on in the normal mode and turned off in the sleep mode.

The first to fourth logic circuits 21 to 51 may receive the second power through the second power lines PWL2. Each of the logic circuits 22 to 51 may further include retention flip-flops. The second power lines PWL2 may be connected to the retention flip-flops. The retention flip-flops may operate by receiving the second power from the second power lines PWL2.

Each retention flip-flop may correspond to one normal flip-flop included in a corresponding logic circuit. For example, the retention flip-flop may form a pair with the corresponding normal flip-flop and may be disposed adjacent to the corresponding normal flip-flop. Each retention flip-flop may receive and store data latched in the corresponding normal flip-flop when an operation mode changes from the normal mode to the sleep mode. In the sleep mode, the retention flip-flops may keep the stored data by using the second power lines PWL2. In this manner, data stored in the normal flip-flop may be stored by the corresponding retention flip-flop in the sleep mode.

The normal flip-flops and the corresponding retention flip-flops may be distributed in each logic circuit. In the logic circuit, a plurality of power lines may be provided to route (or supply) the second power to the distributed retention flip-flops, and the provided power lines may be connected to the second power lines PWL2. Accordingly, a large amount of current may be consumed to route the second power to the provided power lines. This current consumption may increase as the degree of integration of the logic circuit increases and the area of the logic circuit increases.

Figure 2:
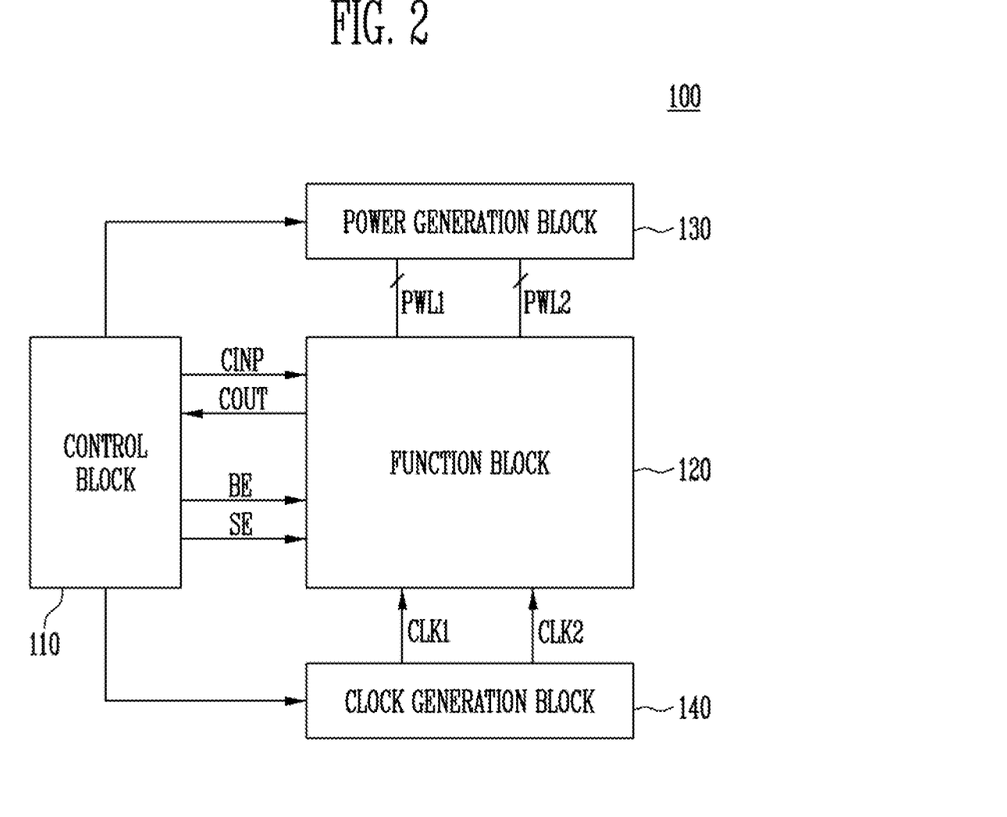
FIG. 2 is a block diagram showing a semiconductor device according to an embodiment of the present invention.

FIG. 2 is a block diagram showing a semiconductor device 100 according to an embodiment of the present invention.

Referring to FIG. 2, the semiconductor device 100 may include a control block 110, a function block 120, a power generation block 130, and a clock generation block 140.

The control block 110 may control the function block 120, the power generation block 130, and the clock generation block 140. The control block 110 may transmit a chip input signal CINP to the function block 120 in a normal mode, and receive a chip output signal COUT as a result of an operation on the chip input signal CINP from the function block 120.

In the normal mode, a control block 110 may enable block enable signals BE. According to the block enable signals BE, the function block 120 may be activated. The activated function block 120 may process the chip input signal CINP and provide the chip output signal COUT, as a result of the process, to the control block 110.

A sleep request may be generated. For example, when the function block 120 is not used for a certain period of time, the control block 110 may generate a sleep request. As another example, the sleep request may be generated by a predetermined signal provided by a user. As still another example, when the function block 120 is not accessed for a certain period of time, the control block 110 may generate the sleep request. It will be understood that the sleep request may be generated in various manners.

According to the sleep request, the control block 110 may control the function block 120, the power generation block 130, and the clock generation block 140 so that the function block 120 enters the sleep mode from the normal mode.

The control block 110 may disable sleep enable signals SE in the normal mode. When the semiconductor device 100 enters the sleep mode from the normal mode, the control block 110 may enable the sleep enable signals SE. According to the sleep enable signals SE, the function block 120 may store data latched in the normal flip-flops thereinside in the retention circuit thereinside. When the semiconductor device 100 enters the normal mode from the sleep mode, the control block 110 may enable the sleep enable signals SE. According to the sleep enable signals SE, the data stored in the retention circuit may be latched again in the normal flip-flops.

The power generation block 130 may be connected to the function block 120 through the first and second power lines PWL1 and PWL2. The power generation block 130 may operate in response to the control of the control block 110. In the normal mode, the power generation block 130 may supply the first and second power respectively to the first and second power lines PWL1 and PWL2 in response to the control of the control block 110. When an operation mode changes from the normal mode to the sleep mode or from the sleep mode to the normal mode, the power generation block 130 may supply the first and second power respectively to the first and second power lines PWL1 and PWL2. In the sleep mode, the power generation block 130 may block the first power of the first power lines PWL1 and supply the second power in response to the control of the control block 110.

The first power is supplied to the normal flip-flops, and the second power is supplied to the retention circuit. In addition, when an operation mode changes from the normal mode to the sleep mode, data stored in the normal flip-flops in the function block 120 may be stored in the retention circuit. Accordingly, even when the first power is blocked in the sleep mode, the data latched in the normal flip-flops may be retained by the retention circuit.

The clock generation block 140 may supply a plurality of clocks CLK1 and CLK2. In FIG. 2, the clock generation block 140 is illustrated as supplying two clocks CLK1 and CLK2. The clock generation block 140 may operate in response to the control of the control block 110. In the sleep mode, the first and second clocks CLK1 and CLK2 may be blocked.

Figure 3:
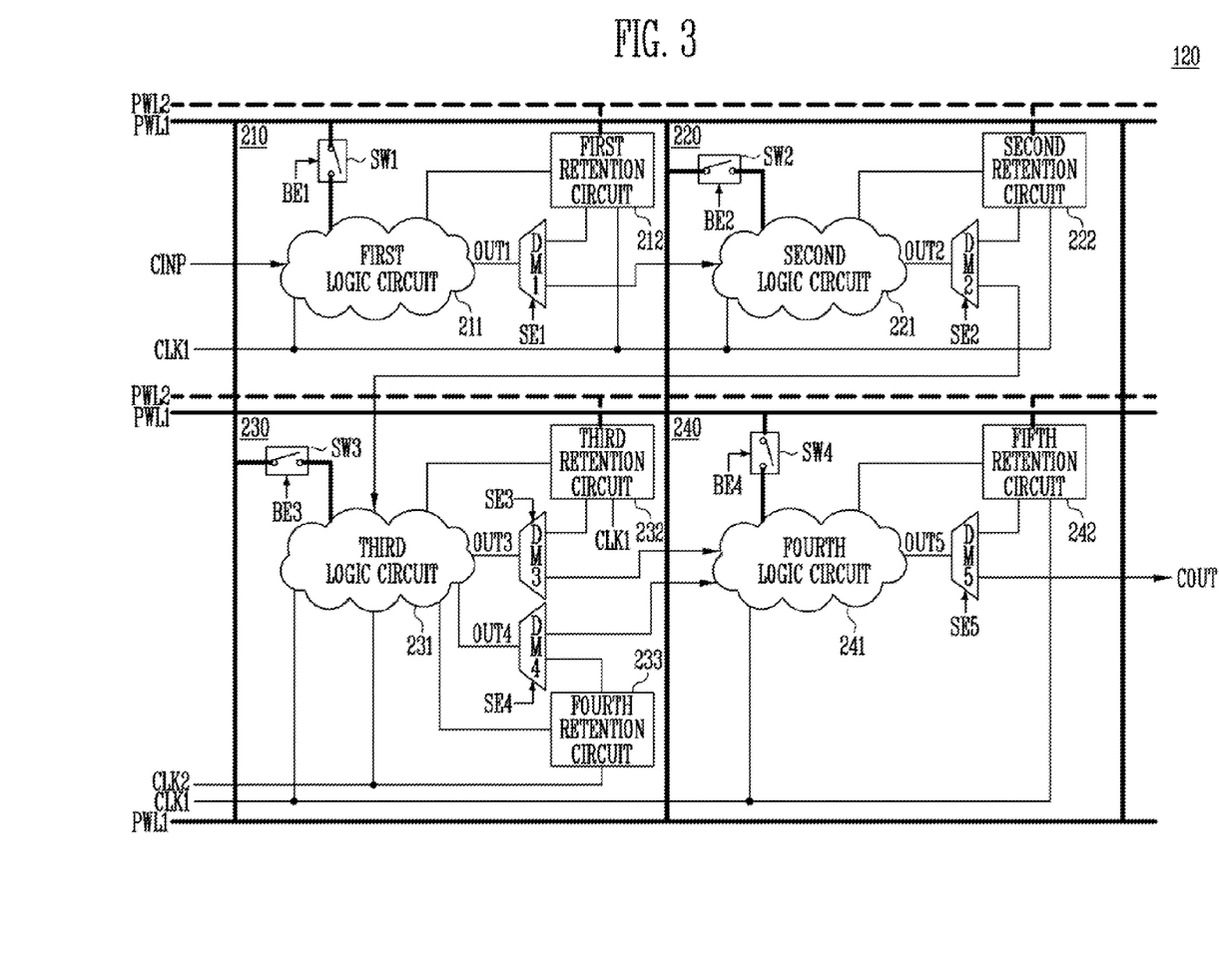
FIG. 3 is a detailed diagram of a function block shown in FIG. 2.

FIG. 3 is a detailed diagram of the function block 120 shown in FIG. 2.

Referring to FIG. 3, the function block 120 may include a plurality of grid regions (or unit regions) 210 to 240 defined by first power lines PWL1. In FIG. 3, four grid regions 210 to 240 are provided in the function block 120, as an example. First power may be supplied from a power generation block 130 (refer to FIG. 2) through the first power lines PWL1. The first power may be supplied to logic circuits 211 to 241 of the grid regions 210 to 240 through the first power lines PWL1. Second power may be supplied from the power generation block 130 through second power lines PWL2.

The first to fourth grid regions 210 to 240 may include first to fourth logic circuits 211 to 241, respectively. In a normal mode, each of the first to fourth logic circuits 211 to 241 performs logic operations on an input thereto to provide an output. For example, each logic circuit may include circuits for performing addition, multiplication, conditional processing, or the like. For example, each logic circuit may include some components, such as an adder, a multiplier, a NAND gate, a NOR gate, a multiplexer (MUX), and normal flip-flops for latching data.

The first to fourth grid regions 210 to 240 may include first to fourth switches SW1 to SW4, respectively. The first switch SW1 may be connected between one of the first power lines PWL1 and the first logic circuit 211. The second switch SW2 may be connected between one of the first power lines PWL1 and the second logic circuit 221. The third switch SW3 may be connected between one of the first power lines PWL1 and the third logic circuit 231. The fourth switch SW4 may be connected between one of the first power lines PWL1 and the fourth logic circuit 241. When each switch is turned on, a corresponding logic circuit may be electrically connected to the first power lines PWL1.

The first to fourth switches SW1 to SW4 may be turned on in response to first to fourth block enable signals BE1 to BE4, respectively. The first to fourth block enable signals BE1 to BE4 may be provided by the control block 110 (refer to FIG. 2). When each of the first to fourth block enable signals BE1 to BE4 are activated, a corresponding switch may be turned on. When each of first to fourth block enable signals BE1 to BE4 are deactivated, a corresponding switch may be turned off.

In the normal mode, the first to fourth logic circuits 211 to 241 may receive first power through the first power lines PWL1 to operate. In the normal mode, the first to fourth logic circuits 211 to 241 may receive first and second clocks CLK1 and CLK2 from a clock generation block 140. Each logic circuit may operate in synchronization with the received clock. In FIG. 3, for example, the first, second, and fourth logic circuits 211, 221, and 241 are illustrated as using the first clock CLK1, while the third logic circuit 231 is illustrated as using the first and second clocks CLK1 and CLK2.

In the normal mode, each logic circuit performs an operation on an input signal in synchronization with at least one received clock, and generates an output signal. The first to fourth logic circuits 211 to 241 may be understood as being connected to each other in various manners. In FIG. 3, the first logic circuit 211 performs an operation on a chip input signal CINP in synchronization with the first clock CLK1 and generates a first output signal OUT1. The second logic circuit 221 performs an operation on the first output signal OUT1 in synchronization with the first clock CLK1 and generates a second output signal OUT2. The third logic circuit 231 performs an operation on the second output signal OUT2 in synchronization with the first and second clocks CLK1 and CLK2 and generates third and fourth output signals OUT3 and OUT4. The fourth logic circuit 241 performs an operation on the third and fourth output signals OUT3 and OUT4 in synchronization with the first clock CLK1, and generates a fifth output signal OUT5. The fifth output signal OUT5 may be provided as a chip output signal COUT.

In a sleep mode, the first power supplied to the first to fourth logic circuits 211 to 241 may be blocked to save power. Data latched in the normal flip-flops included in the first to fourth logic circuits 211 to 241 may be lost in the sleep mode. In the sleep mode, a configuration to retain the data latched in the normal flip-flops may be required.

Nevertheless, each logic circuit may not include retention flip-flops for retaining the data of the normal flip-flops during the sleep mode. Accordingly, the second power lines PWL2 which supply power during the sleep mode may not be connected to the logic circuits 211 to 241.

According to the embodiment of the present invention, each of the first to fourth grid regions 210 to 240 may include at least one retention circuit separated from a corresponding logic circuit. Each retention circuit may be provided in an area separated from an area in which a logic circuit of a corresponding grid region is located. Each retention circuit may be connected to one of the second power lines PWL2 and receive second power from the second power lines PWL2. Each retention circuit may latch data using the second power during the sleep mode.

The first grid region 210 may include a first retention circuit 212 and a first demultiplexer DM1 connected between the first retention circuit 212 and the first logic circuit 211.

The first demultiplexer DM1 may transmit the first output signal OUT1 to the second logic circuit 221 when a first sleep enable signal SE1 from the control block 110 (refer to FIG. 2) is deactivated. That is, the first demultiplexer DM1 may transmit the first output signal OUT1 to the second logic circuit 221 in the normal mode. The first demultiplexer DM1 may transmit the first output signal OUT1 to the first retention circuit 212 when the first sleep enable signal SE1 is activated. That is, the first demultiplexer DM1 may transmit the first output signal OUT1 to the first retention circuit 212 when an operation mode changes from the normal mode to the sleep mode.

The first retention circuit 212 may be connected to one of the second power lines PWL2. The first retention circuit 212 may receive the second power to operate. The first retention circuit 212 may receive and store the first output signal OUT1 received through the first demultiplexer DM1. The normal flip-flops of the first logic circuit 211 and the first retention circuit 212 may form a scan chain, and data stored in the normal flip-flops may be sequentially output as the first output signal OUT1 when an operation mode changes from the normal mode to the sleep mode. This will be described in more detail with reference to FIGS. 4 and 5.

In some embodiments, the first retention circuit 212 may receive the first clock CLK1 like the first logic circuit 211, and receive and store the first output signal OUT1 in synchronization with the first clock CLK1.

The second grid region 220 includes a second retention circuit 222 and a second demultiplexer DM2. The second demultiplexer DM2 may transmit the second output signal OUT2 to the third logic circuit 231 when the second sleep enable signal SE2 from the control block 110 is deactivated. In addition, the second demultiplexer DM2 may transmit the second output signal OUT2 to the second retention circuit 222 when the second sleep enable signal SE2 is activated.

The second retention circuit 222 may receive the second power through one of the second power lines PWL2. The second retention circuit 222 may receive and store the second output signal OUT2 received through the second demultiplexer DM2. The normal flip-flops of the second logic circuit 221 and the second retention circuit 222 may form a scan chain, and data stored in the normal flip-flops may be sequentially output as the second output signal OUT2 when an operation mode changes from the normal mode to the sleep mode.

In some embodiments, the second retention circuit 222 may receive the first clock CLK1 like the second logic circuit 221, and receive and store the second output signal OUT2 in synchronization with the first clock CLK1.

The third grid region 230 includes third and fourth retention circuits 232 and 233, and third and fourth demultiplexers DM3 and DM4. The third demultiplexer DM3 may transmit the third output signal OUT3 to the fourth logic circuit 241 when a third sleep enable signal SE3 from the control block 110 is deactivated. The third demultiplexer DM3 may transmit the third output signal OUT3 to the third retention circuit 232 when the third sleep enable signal SE3 is activated. The fourth demultiplexer DM4 may transmit the fourth output signal OUT4 to the fourth logic circuit 241 when a fourth sleep enable signal SE4 from the control block 110 is deactivated. The fourth demultiplexer DM4 may transfer the fourth output signal OUT4 to the fourth retention circuit 233 when the fourth sleep enable signal SE4 is activated.

According to an embodiment of the present invention, retention circuits equal in number to clocks used in a corresponding grid region may be provided. One retention circuit may correspond to one clock. In FIG. 3, the third grid region 230 may use two clocks CLK1 and CLK2 and include two retention circuits 232 and 233. The third and fourth retention circuits 232 and 233 may receive the second power through one of the second power lines PWL2 to operate. The third and fourth retention circuits 232 and 233 may respectively receive and store the third and fourth output signals OUT3 and OUT4 when an operation mode changes from the normal mode to the sleep mode.

The third retention circuit 232 may receive the first clock CLK1 to operate. The normal flip-flops using the first clock CLK1 in the third logic circuit 231 and the third retention circuit 232 may form a scan chain. When an operation mode changes from the normal mode to the sleep mode, data in the normal flip-flops using the first clock CLK1 in the third logic circuit 231 may be sequentially output as the third output signal OUT3.

The fourth retention circuit 233 may receive the second clock CLK2 to operate. The normal flip-flops using the second clock CLK2 in the third logic circuit 231, and the fourth retention circuit 233 may form a scan chain. When an operation mode changes from the normal mode to the sleep mode, data in the normal flip-flops using the second clock CLK2 in the third logic circuit 231 may be sequentially output as the fourth output signal OUT4.

The fourth grid region 240 may include a fifth retention circuit 242 and a fifth demultiplexer DM5. When a fifth sleep enable signal SE5 from the control block 110 is deactivated, the fifth demultiplexer DM5 may transmit the fifth output signal OUT5 as the chip output signal COUT. When the fifth sleep enable signal SE5 is activated, the fifth demultiplexer DM5 may transmit the fifth output signal OUT5 to the fifth retention circuit 242.

The fifth retention circuit 242 may receive the second power through one of the second power lines PWL2 to operate. The fifth retention circuit 242 may receive and store the fifth output signal OUT5 received through the fifth demultiplexer DM5. The normal flip-flops of the fourth logic circuit 241, and the fifth retention circuit 242 may form a scan chain, and data latched in the normal flip-flops may be sequentially output to the fifth retention circuit 242 when an operation mode changes from the normal mode to the sleep mode.

In some embodiments, the fifth retention circuit 242, like the fourth logic circuit 241, may receive the first clock CLK1, and receive and store the fifth output signal OUT5 in synchronization with the first clock CLK1.

In some embodiments, each of the retention circuits 212, 222, 232, 233, and 242 may include a storage unit for storing data. For example, each of the retention circuits 212, 222, 232, 233, and 242 may include a storage unit, such as a static RAM (SRAM), a dynamic RAM (DRAM), a synchronous DRAM (SDRAM), a flash memory, a phase-change RAM (PRAM), a magnetic RAM (MRAM), a resistive RAM (RRAM), and a ferroelectric RAM (FRAM).

In some embodiments, each of the retention circuits 212, 222, 232, 233, and 242 may include a plurality of retention flip-flops for storing data.

Figure 4:
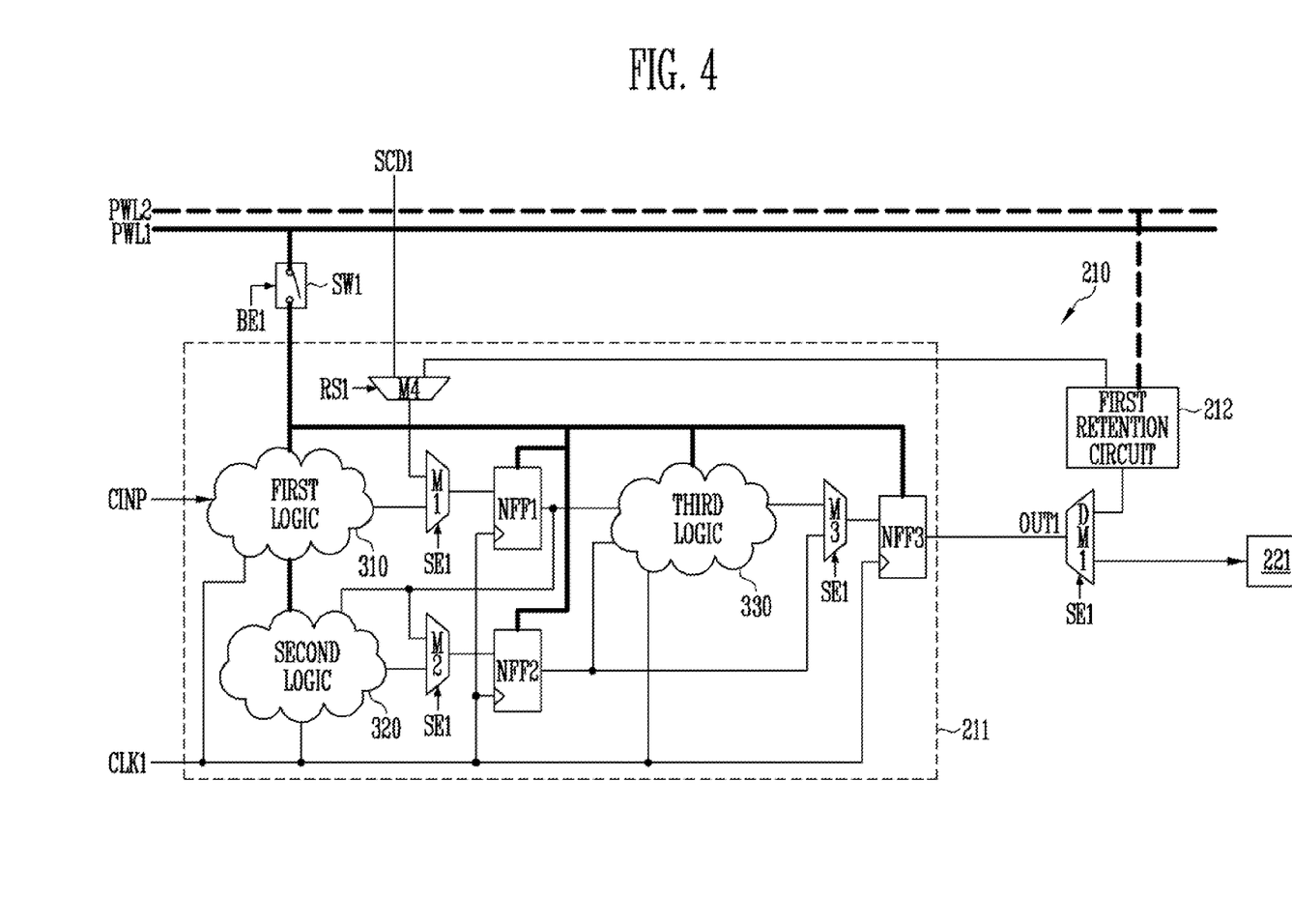
FIG. 4 is a detailed diagram of a first grid region shown in FIG. 3.
Figure 5:
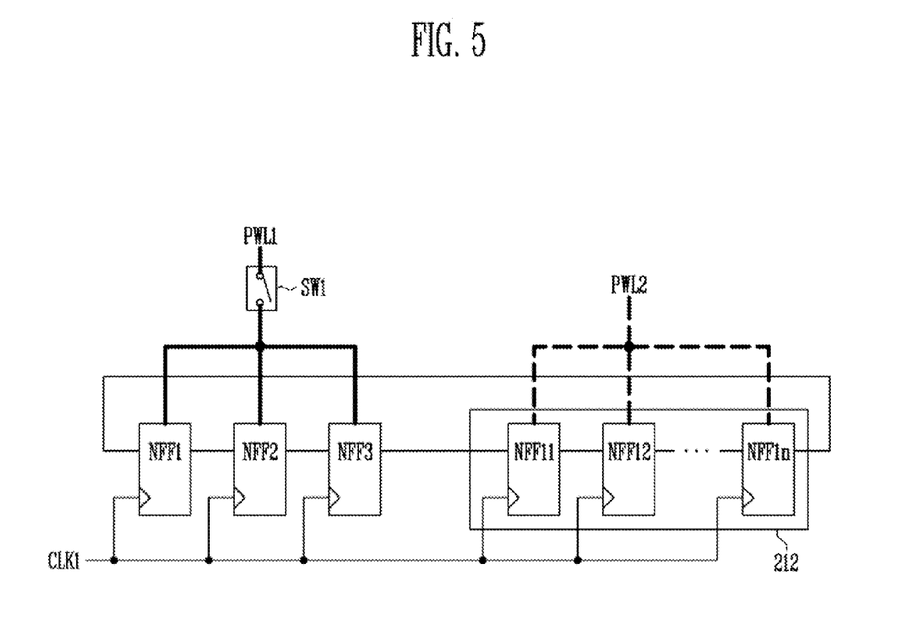
FIG. 5 is a diagram for describing an electrical connection relationship between first to third normal flip-flops and a first retention circuit shown in FIG. 4 when an operation mode changes.

FIG. 4 is a detailed diagram of the first grid region 210 shown in FIG. 3. FIG. 5 is a diagram for describing an electrical connection relationship between first to third normal flip-flops shown in FIG. 4 and the first retention circuit 212 when an operation mode changes, for example, from a normal mode to a sleep mode or from the sleep mode to the normal mode.

Referring to FIG. 4, the first grid region 210 includes a first switch SW1, a first logic circuit 211, a first demultiplexer DM1, and a first retention circuit 212.

The first logic circuit 211 includes a plurality of logics 310 to 330, first to fourth multiplexers M1 to M4, and a plurality of normal flip-flops NFF1 to NFF3.

The first to third logics 310 to 330 and the first to third normal flip-flops NFF1 to NFF3 receive first power to operate. The first to third logics 310 to 330 and the first to third normal flip-flops NFF1 to NFF3 may receive the first clock CLK1 and operate in synchronization therewith. Each of the first to third logics 310 to 330 may perform a specific operation on an input. For example, each logic may include an adder, a multiplier, a NAND gate, a NOR gate, or a multiplexer (MUX).

In a normal mode, the first logic 310 may receive a chip input signal CINP, perform a predetermined operation, and transmit an output signal thereof to the first multiplexer M1.

The output signal of the first logic 310 may be transmitted to the second and third logics 320 and 330 through the first multiplexer M1 and the first normal flip-flop NFF1. In the normal mode, the second logic 320 may perform an operation on the output signal of the first logic 310 as an input, and transmit an output signal thereof to the second multiplexer M2. The output signal of the second logic 320 may be transmitted to the third logic 330 through the second multiplexer M2 and the second normal flip-flop NFF2. In the normal mode, the third logic 330 may perform an operation on the output signal of the first logic 310 and the output signal of the second logic 320 as an input, and transmit an output signal thereof to the third multiplexer M3. The output signal of the third logic 330 may be transmitted as a first output signal OUT1 through the third multiplexer M3 and the third normal flip-flop NFF3. In the normal mode, the first output signal OUT1 may be output to the second logic circuit 221 (refer to FIG. 3) through the first demultiplexer DM1.

A multiplexer and at least one normal flip-flop, which correspond to each of the logics 310 to 330, may be provided in the first logic circuit 211.

The first multiplexer M1 may receive the output signal of the first logic 310 and an output signal of a fourth multiplexer M4. The first multiplexer M1 may output one of the output signal of the first logic 310 and the output signal of the fourth multiplexer M4 to the first normal flip-flop NFF1 in response to a first sleep enable signal SE1. In the normal mode, the first sleep enable signal SE1 may be deactivated. When the first sleep enable signal SE1 is deactivated, the first multiplexer M1 may transmit the output signal of the first logic 310 to the first normal flip-flop NFF1. When an operation mode changes from the normal mode to a sleep mode, the first sleep enable signal SE1 may be activated. When an operation mode changes from the sleep mode to the normal mode, the first sleep enable signal SE1 is activated. When the first sleep enable signal SE1 is activated, the first multiplexer M1 may transmit the output signal of the fourth multiplexer M4 to the first normal flip-flop NFF1.

The first normal flip-flop NFF1 may receive the first clock CLK1. The first normal flip-flop NFF1 may latch the output signal of the first multiplexer M1 in synchronization with the first clock CLK1, and output latched data.

The second multiplexer M2 may receive the output signal of the second logic 320 and an output signal of the first normal flip-flop NFF1. When the first sleep enable signal SE1 is deactivated, the second multiplexer M2 may output the output signal of the second logic 320 to the second normal flip-flop NFF2. When a second sleep enable signal SE2 is activated, the second multiplexer M2 may output the output signal of the first normal flip-flop NFF1 to the second normal flip-flop NFF2. That is, the second multiplexer M2 may transmit the output signal of the second logic 320 to the second multiplexer M2 in the normal mode. The second multiplexer M2 may output the output signal of the first normal flip-flop NFF1 to the second normal flip-flop NFF2 when an operation mode changes from the normal mode to the sleep mode or from the sleep mode to the normal mode.

The second normal flip-flop NFF2 may latch the output signal of the second multiplexer M2 in synchronization with the first clock CLK1, and output latched data.

The third multiplexer 13 may receive the output signal of the third logic 330 and an output signal of the second normal flip-flop NFF2. When the first sleep enable signal SE1 is deactivated, the third multiplexer M3 may output the output signal of the third logic 330 to the third normal flip-flop NFF3. When the first sleep enable signal SE1 is activated, the third multiplexer M3 may output the output signal of the second normal flip-flop NFF2 to the third normal flip-flop NFF3.

The third normal flip-flop NFF3 may latch the output signal of the third multiplexer M3 in synchronization with the first clock CLK1, and output latched data as the first output signal OUT1.

That is, each of the first to third multiplexers M1 to M3 may transmit an output signal of a corresponding logic to a corresponding normal flip-flop in the normal mode. Each of the first to third multiplexers M1 to M3 may transfer a signal received, not by a first input terminal to which the output signal of the corresponding logic is received, but by a second input terminal, among the first and second input terminals, to the corresponding normal flip-flop when an operation mode changes from the normal mode to the sleep mode or from the sleep mode to the normal mode.

The first retention circuit 212 may be separated from the first logic circuit 211. The first retention circuit 212 may receive the first output signal OUT1 through the first demultiplexer DM1.

In some embodiments, the first retention circuit 212 may receive the first output signal OUT1 without receiving the first clock CLK1, as shown in FIG. 4. In other embodiments, the first retention circuit 212 may receive the first clock CLK1 like the first logic circuit 211, and receive and store the first output signal OUT1 in synchronization with the first clock CLK1. For example, the first retention circuit 212 may operate synchronously or asynchronously.

In some embodiments, scan chain data may be input to each of the logic circuits 211 to 241 (refer to FIG. 3). By inputting the scan chain data to the normal flip-flops of each logic circuit, data latched therein may be changed. Accordingly, each of the logic circuits 211 to 241 may be selectively controlled.

The fourth multiplexer M4 may receive first scan chain data SCD1 and an output signal of the first retention circuit 212. Meanwhile, a recovery signal may be input to each of the logic circuits 211 to 241. The recovery signal may be provided from the control block 110. The fourth multiplexer M4 may output one of the first scan chain data SCD1 and the output signal of the first retention circuit 212 to the first multiplexer M1 in response to a first recovery signal RS1. The first recovery signal RS1 may be activated when an operation mode changes from the sleep mode to the normal mode. In addition, the first recovery signal RS1 may also be activated when an operation mode changes from the normal mode to the sleep mode. The fourth multiplexer M4 may transmit the output signal from the first retention circuit 212 to the first multiplexer M1 when the first recovery signal RS1 is activated. The fourth multiplexer M4 may transmit the first scan chain data SCD1 to the first multiplexer M1 when the first recovery signal RS1 is deactivated.

The first to third normal flip-flops NFF1 to NFF3 and the first retention circuit 212 may form a scan chain through the first to fourth multiplexers M1 to M4 and the first demultiplexer DM1. The first normal flip-flop NFF1 may be connected to an output line of the first retention circuit 212 through the first and fourth multiplexers M1 and M4. The second normal flip-flop NFF2 may be connected to an output line of the first normal flip-flop NFF2 through the second multiplexer M2. The third normal flip-flop NFF3 may be connected to an output line of the second normal flip-flop NFF2 through the third multiplexer M3. The first retention circuit 212 may be connected to an output line of the third normal flip-flop NFF3 through the first demultiplexer DM1.

The first sleep enable signal SE1 and the first recovery signal RS1 may be activated when an operation mode changes from the normal mode to the sleep mode or from the sleep mode to the normal mode. Referring to FIG. 5, the first to third normal flip-flops NFF1 to NFF3 and the first retention circuit 212 may be circularly connected when an operation mode changes from the normal mode to the sleep mode or from the sleep mode to the normal mode.

In some embodiments, as illustrated in FIG. 5, the first retention circuit 212 may include a plurality of retention flip-flops RFF11 to RFF1$n$. The first to $n^{th}$ retention flip-flops RFF11 to RFF1$n$ may be connected to second power lines PWL2. The first to $nt^h$ retention flip-flops RFF11 to RFF1$n$ may form a scan chain with the normal flip-flops NFF1 to NFF3, and operate in synchronization with the first clock CLK1.

In some embodiments, the number of first to $n^{th}$ retention flip-flops RFF11 to RFF1$n$ may be the same as or greater than the number of the normal flip-flops NFF1 to NFF3.

When an operation mode changes from the normal mode to the sleep mode, data latched in the first to third normal flip-flops NFF1 to NFF3 may be sequentially shifted to the first retention circuit 212 in synchronization with the first clock CLK1, and latched in all or some of the first to $n^{th}$ retention flip-flops RFF11 to RFF1$n$. In addition, the first power may be blocked in the sleep mode.

When an operation mode changes from the sleep mode to the normal mode, the data latched in all or some of the first to $n^{th}$ retention flip-flops may be sequentially shifted to the first to third normal flip-flops NFF1 to NFF3 in synchronization with the first clock CLK1, and latched in the first to third normal flip-flops NFF1 to NFF3. In addition, the first power may be supplied in the normal mode.

For example, each of the retention flip-flops is assumed to form a pair with a corresponding normal flip-flop to be disposed in the first logic circuit 211, unlike those shown in FIG. 4. Each of the retention flip-flops may be disposed adjacent to the corresponding normal flip-flop, for example, to store data latched in the normal flip-flop in the sleep mode. Meanwhile, in the sleep mode, the second power may be provided to operate the retention flip-flops. In this case, many power lines may be required to route the second power to the retention flip-flops in the logic circuit. A large amount of current may be consumed due to the second power routed by the power lines. Such current consumption may increase as the degree of integration of each logic circuit increases and the area of each logic circuit increases.

According to the embodiment of the present invention, the first retention circuit 212 may be provided in an area separated from an area in which the first logic circuit 211 is provided. Accordingly, the power lines for providing the second power may be connected to the first retention circuit 212 without being routed in the first logic circuit 211. Accordingly, there is no current consumption for routing the second power to the first logic circuit 211. In addition, since the power lines for routing the second power are not connected to the first logic circuit 211, the first logic circuit 211 may be designed more efficiently.

According to an embodiment of the present invention, the normal flip-flops NFF1 to NFF3 of the first logic circuit 211 and the first retention circuit 212 may form a scan chain. Accordingly, even when the first retention circuit 212 is provided in the area separated from the area in which the first logic circuit 211 is provided, the data latched in the normal flip-flops NFF1 to NFF3 of the first logic circuit 211 may be retained by the first retention circuit 212 in the sleep mode.

Figure 6:
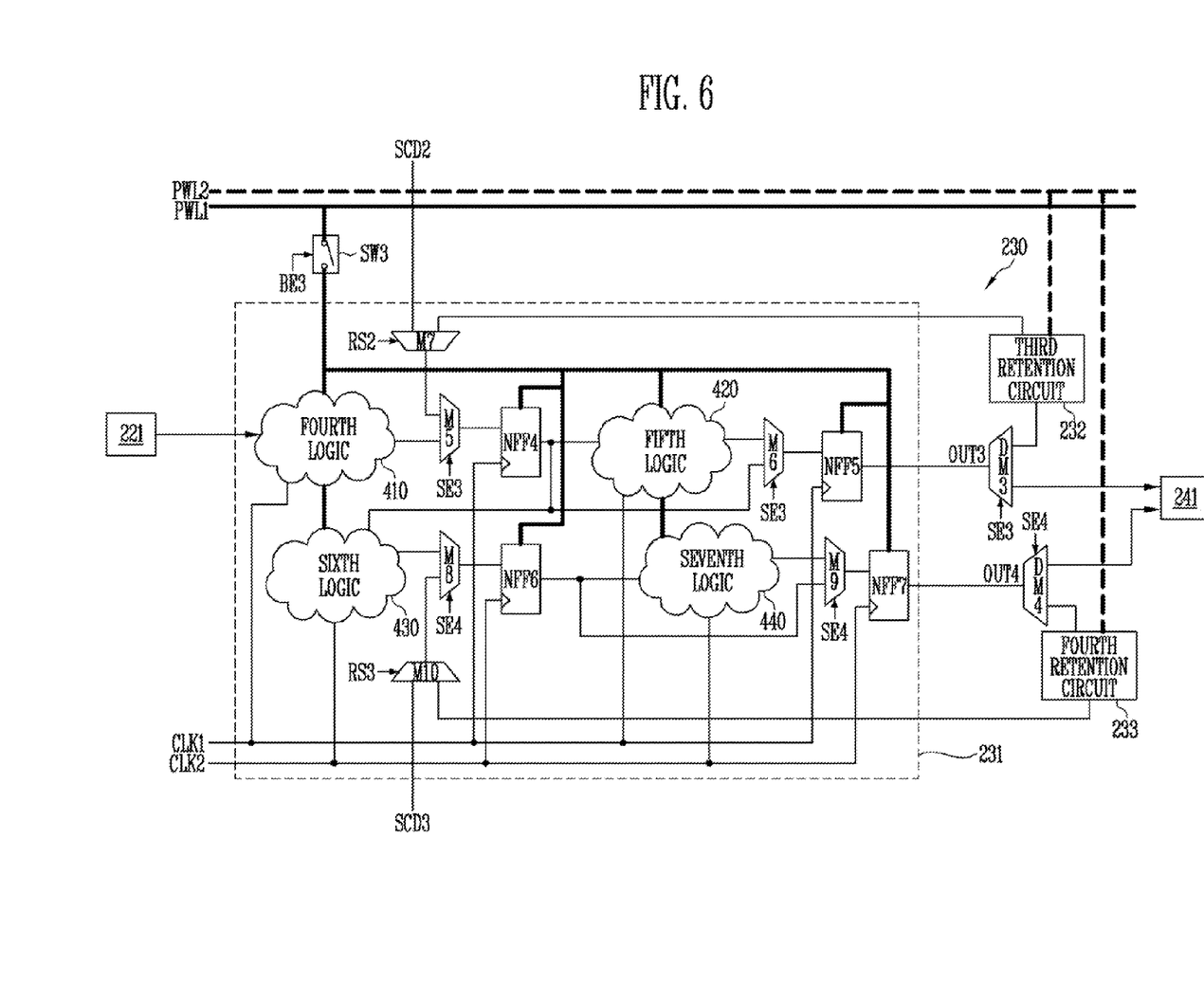
FIG. 6 is a detailed block diagram of a third grid region shown in FIG. 3.

FIG. 6 is a detailed diagram of the third grid region 230 shown in FIG. 3, which receives two or more clocks CLK1 and CLK2.

Referring to FIG. 6, the third grid region 230 may include a third switch SW3, a third logic circuit 231, third and fourth demultiplexers DM3 and DM4, and third and fourth retention circuits 232 and 233.

The third logic circuit 231 may include a plurality of logics 410 to 440, a plurality of multiplexers M5 to M10, and a plurality of normal flip-flops NFF4 to NFF7.

The fourth to seventh logics 410 to 440 and the fourth to seventh normal flip-flops NFF4 to NFF7 may operate by receiving first power. The fourth and fifth logics 410 and 420 and corresponding normal flip-flops NFF4 and NFF5 may operate by receiving a first clock CLK1. The sixth and seventh logics 430 and 440 and corresponding normal flip-flops NFF6 and NFF7 may operate by receiving a second clock CLK2.

It may be understood that the fourth to seventh logics 410 to 440 are connected in various manners. In a normal mode, the fourth logic 410 may receive an output signal from the second logic circuit 221, perform a predetermined operation, and transmit a result thereof to the fifth multiplexer M5. An output signal of the fourth logic 410 may be transmitted to the fifth logic 420 and the sixth logic 430 through the fifth multiplexer M5 and the fourth normal flip-flop NFF4. In the normal mode, the fifth logic 420 may perform an operation on the output signal of the fourth logic 410 as an input, and transmit an output signal to the sixth multiplexer M6. The output signal of the fifth logic 420 may be transmitted as a third output signal OUT3 through the sixth multiplexer M6 and the fifth normal flip-flop NFF5. The third output signal OUT3 may be transmitted to the fourth logic circuit 241 through the third demultiplexer DM3, as described with reference to FIG. 3. In the normal mode, the sixth logic 430 may perform an operation on the output signal of the fourth logic 410 as an input, and transmit an output signal to the eighth multiplexer M8. The output signal of the sixth logic 430 may be transmitted to the seventh logic 440 through the eighth multiplexer M8 and the sixth normal flip-flop NFF6. In the normal mode, the seventh logic 440 may perform an operation on the output signal of sixth logic 430 as an input, and transmit an output signal to the ninth multiplexer M9. The output signal of the seventh logic 440 may be transmitted as a fourth output signal OUT4 through the ninth multiplexer M9 and the seventh normal flip-flop NFF7. The fourth output signal OUT4 may be transmitted to the fourth logic circuit 241 through the fourth demultiplexer DM4, as described with reference to FIG. 3.

A multiplexer and at least one normal flip-flop, which correspond to each of the fourth to seventh logics 410 to 440, may be provided.

The fifth multiplexer M5 may receive the output signal of the fourth logic 410 and an output signal of the seventh multiplexer M7. The fifth multiplexer M5 may operate in response to a third sleep enable signal SE3. In the normal mode, the third sleep enable signal SE3 may be deactivated. When an operation mode changes from the normal mode to a sleep mode or from the sleep mode to the normal mode, the third sleep enable signal SE3 may be activated. When the third sleep enable signal SE3 is deactivated, the fifth multiplexer M5 may transmit the output signal of the fourth logic 410 to the fourth normal flip-flop NFF4. When the third sleep enable signal SE3 is activated, the fifth multiplexer M5 may transmit the output signal of the seventh multiplexer M7 to the fourth normal flip-flop NFF4.

The fourth normal flip-flop NFF4 may latch an output signal of the fifth multiplexer M5 in synchronization with the first clock CLK1, and output latched data.

The sixth multiplexer M6 may receive the output signal of the fifth logic 420 and an output signal of the fourth normal flip-flop NFF4. The sixth multiplexer M6 may transmit the output signal of the fifth logic 420 to the fifth normal flip-flop NFF5 when the third sleep enable signal SE3 is deactivated. The sixth multiplexer M6 may transmit the output signal of the fourth normal flip-flop NFF4 to the fifth normal flip-flop NFF5 when the third sleep enable signal SE3 is activated.

The fifth normal flip-flop NFF5 may latch an output signal of the sixth multiplexer M6 in synchronization with the first clock CLK1, and transmit latched data as the third output signal OUT3.

The third retention circuit 232 corresponding to the normal flip-flops NFF4 and NFF5 using the first clock CLK1 may be provided. The third retention circuit 232 may be located outside the third logic circuit 231. The third retention circuit 232 may be connected to the fifth normal flip-flop NFF5 through the third demultiplexer DM3. An output line of the third retention circuit 232 may be connected to an input line of the seventh multiplexer M7.

In some embodiments, the seventh multiplexer M7, which receives second scan chain data SCD2 and an output signal of the third retention circuit 232 and transmits one of the second scan chain data SCD2 and the output signal of the third retention circuit 232 to the fifth multiplexer M5 in response to a second recovery signal RS2, may be provided. The second recovery signal RS2, like the first recovery signal RS1, may be activated when an operation mode changes from the sleep mode to the normal mode. In addition, the second recovery signal RS2 may also be activated when an operation mode changes from the normal mode to the sleep mode. The seventh multiplexer M7 may transmit the output signal of the third retention circuit 232 to the fifth multiplexer M5 when the second recovery signal RS2 is activated.

The fourth and fifth normal flip-flops NFF4 and NFF5 and the third retention circuit 232 may form a scan chain through the fifth to seventh multiplexers M5 to M7 and the third demultiplexer DM3. The fourth normal flip-flop NFF4 may be connected to the output line of the third retention circuit 232 through the fifth and seventh multiplexers M5 and M7. The fifth normal flip-flop NFF5 may be connected to an output line of the fourth normal flip-flop NFF4 through the sixth multiplexer M6. The third retention circuit 232 may be connected to the fifth normal flip-flop NFF5 through the third demultiplexer DM3.

The eighth multiplexer M8 may receive the output signal of the sixth logic 430 and an output signal of the tenth multiplexer M10. The eighth multiplexer M8 may operate in response to a fourth sleep enable signal SE4. The fourth sleep enable signal SE4 may be activated when an operation mode changes from the normal mode to the sleep mode or from the sleep mode to the normal mode. The eighth multiplexer M8 may transmit the output signal of the tenth multiplexer M10 to the sixth normal flip-flop NFF6 when the fourth sleep enable signal SE4 is activated.

The sixth normal flip-flop NFF6 may latch an output signal of the eighth multiplexer M8 in synchronization with the second clock CLK2, and output latched data.

The ninth multiplexer M9 may receive the output signal of the seventh logic 440 and an output signal of the sixth normal flip-flop NFF6. The ninth multiplexer M9 may transmit the output signal of the sixth normal flip-flop NFF6 to the seventh normal flip-flop NFF7 when the fourth sleep enable signal SE4 is activated.

The seventh normal flip-flop NFF7 may latch an output signal of the ninth multiplexer M9 in synchronization with the second clock CLK2, and transmit latched data as the fourth output signal OUT4.

The retention circuit 233 corresponding to the normal flip-flops NFF6 and NFF7 using the second clock CLK2 may be provided. The fourth retention circuit 233 may be located outside the third logic circuit 231. The fourth retention circuit 233 may receive the fourth output signal OUT4 through the fourth demultiplexer DM4 when the fourth sleep enable signal SE4 is activated. The fourth retention circuit 233 may store the fourth output signal OUT4 as data. An output line of the fourth retention circuit 233 may be connected to an input line of the tenth multiplexer M10.

In some embodiments, the tenth multiplexer M10, which receives third scan chain data SDC3 and an output signal of the fourth retention circuit 233 and operates in response to a third recovery signal RS3, may be provided. The third recovery signal RS3, like the second recovery signal RS2, may be activated when an operation mode changes from the sleep mode to the normal mode. The tenth multiplexer M10 may transmit the output signal of the fourth retention circuit 233 to the eighth multiplexer M8 when the third recovery signal RS3 is activated.

The sixth and seventh normal flip-flops NFF6 and NFF7 and the fourth retention circuit 233 may form another scan chain through the eighth to tenth multiplexers M8 to M10 and the fourth demultiplexer DM4. The sixth normal flip-flop NFF6 may be connected to the output line of the fourth retention circuit 233 through the eighth and tenth multiplexers M8 to M10. The seventh normal flip-flop NFF7 may be connected to an output line of the sixth normal flip-flop NFF6 through the ninth multiplexer M9. The fourth retention circuit 233 may be connected to an output line of the seventh normal flip-flop NFF7 through the fourth demultiplexer DM4.

Figure 7:
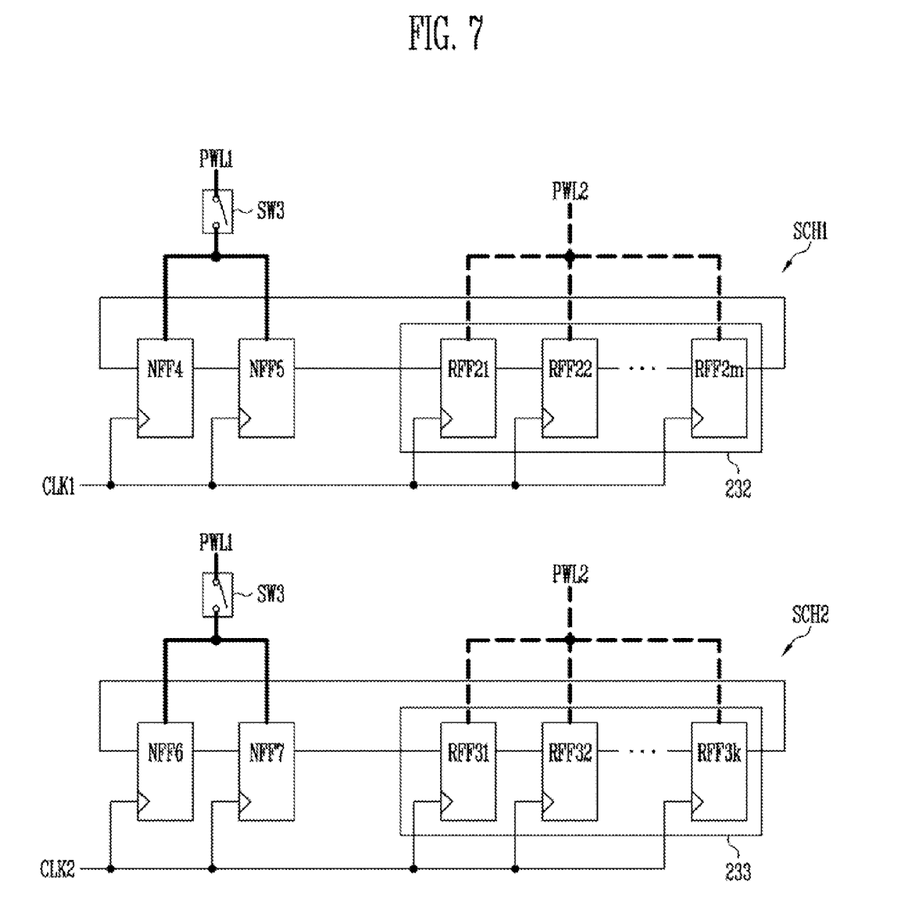
FIG. 7 is a diagram for describing an electrical connection relationship between fourth to seventh normal flip-flops and third and fourth retention circuits shown in FIG. 6 when an operation mode changes.

FIG. 7 is a diagram for describing an electrical connection relationship between the fourth to seventh normal flip-flops NFF4 to NFF7 and the third and fourth retention circuits 232 and 233 shown in FIG. 6 when an operation mode changes, for example, from a normal mode to a sleep mode or from the sleep mode to the normal mode.

Referring to FIGS. 6 and 7, when the third sleep enable signal SE3 is activated, the fourth and fifth normal flip-flops NFF4 and NFF5 and the third retention circuit 232 may be circularly connected. In some embodiments, the third retention circuit 232 may include a plurality of retention flip-flops RFF21 to RFF2$m$. The first to $m^{th}$ retention flip-flops RFF21 to RFF2$m$ may be connected to second power lines PWL2, and may operate even in the sleep mode. The first to $m^{th}$ retention flip-flops RFF21 to RFF2$m$, like the fourth and fifth normal flip-flops NFF4 and NFF5, may operate in synchronization with the first clock CLK1.

When an operation mode changes from the normal mode to the sleep mode, data latched in the fourth and fifth normal flip-flops NFF4 and NFF5 may be sequentially shifted to the third retention circuit 232 in synchronization with the first clock CLK1 and latched to all or some of the first to $m^{th}$ retention flip-flops RFF21 to RFF2$m$.

When an operation mode changes from the sleep mode to the normal mode, the data latched to all or some of the first to $m^{th}$ retention flip-flops RFF21 to RFF2$m$ may be sequentially shifted to the fourth and fifth normal flip-flops NFF4 and NFF5 in synchronization with the first clock CLK1.

The sixth and seventh normal flip-flops NFF6 and NFF7 and the fourth retention circuit 233 may be circularly connected when the fourth sleep enable signal SE4 is activated. In some embodiments, the fourth retention circuit 233 may include a plurality of retention flip-flops RFF31 to RFF3$k$. The first to $k^{th}$ retention flip-flops RFF31 to RFF3$k$ may be connected to the second power lines PWL2 and operate even in the sleep mode. The first to k$^{th}$ retention flip-flops RFF31 to RFF3k, like the sixth and seventh normal flip-flops NFF6 and NFF7, may operate in synchronization with the second clock CLK2.

When an operation mode changes from the normal mode to the sleep mode, data latched in the sixth and seventh normal flip-flops NFF6 and NFF7 may be sequentially shifted to the fourth retention circuit 233 in synchronization with the second clock CLK2, and latched to all or some of the first to k$^{th}$ retention flip-flops RFF31 to RFF3k.

When an operation mode changes from the sleep mode to the normal mode, the data latched in all or some of the first to k$^{th}$ retention flip-flops RFF31 to RFF3k may be sequentially shifted to the sixth and seventh normal flip-flops NFF6 and NFF7 in synchronization with the second clock CLK2, and latched in the sixth and seventh normal flip-flops NFF6 and NFF7.

According to the embodiments of the present invention, a grid region (or a unit region) may include retention circuits equal in number to clocks. In addition, the retention circuits included in the corresponding grid region may be provided in an area separated from an area in which a logic circuit is provided. Accordingly, power lines for providing second power in a sleep mode may be connected to the retention circuits without being routed in the logic circuit. Accordingly, power consumption of a semiconductor device may be reduced.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A semiconductor device comprising:
   first power lines through which first power is supplied;
   a plurality of unit regions defined by the first power lines; and
   second power lines through which second power is supplied,
   wherein each of the unit regions comprises:
      a logic circuit suitable for operating by receiving the first power from at least one of the first power lines during a normal mode; and
      a retention circuit suitable for operating by receiving the second power from at least one of the second power lines, receiving data from the logic circuit when an operation mode changes from the normal mode to a sleep mode, and keeping the data during the sleep mode,
      wherein the logic circuit is electrically separated from the second power lines.

2. The semiconductor device of claim 1, wherein the unit regions are defined in a grid by the first power lines.

3. The semiconductor device of claim 1, wherein the first power is blocked and the second power is supplied to the unit regions, during the sleep mode.

4. The semiconductor device of claim 1, wherein the second power is supplied to the retention circuit during the normal mode and the sleep mode.

5. The semiconductor device of claim 1, wherein, in a corresponding unit region, the retention circuit is provided in an area separated from an area in which the logic circuit is provided.

6. The semiconductor device of claim 1, wherein the retention circuit includes a storage unit suitable for storing the data during the sleep mode.

7. The semiconductor device of claim 1, wherein the retention circuit includes a plurality of retention flip-flops suitable for storing the data during the sleep mode.

8. The semiconductor device of claim 1, wherein the logic circuit includes a plurality of logics and normal flip-flops using the first power,
   the retention circuit includes a plurality of retention flip-flops using the second power, and
   the retention flip-flops receive the data latched in the normal flip-flops when an operation mode changes from the normal mode to the sleep mode and keep the data.

9. The semiconductor device of claim 8, wherein the normal flip-flops and the retention flip-flops form a scan chain.

10. The semiconductor device of claim 1, further comprising a clock generation block suitable for generating first and second clocks.

11. The semiconductor device of claim 10, wherein the logic circuit included in a first unit region among the unit regions includes first logics and first normal flip-flops suitable for operating in synchronization with the first clock.

12. The semiconductor device of claim 11, wherein the retention circuit included in the first unit region includes first retention flip-flops suitable for receiving data from the first normal flip-flops in synchronization with the first clock when an operation mode changes from the normal mode to the sleep mode and keeping the data received from the first normal flip-flops.

13. The semiconductor device of claim 12, wherein the first normal flip-flops and the first retention flip-flops form a scan chain.

14. The semiconductor device of claim 12, wherein the first unit region comprises a first demultiplexer suitable for receiving the data from the logic circuit in the first unit region, transmitting the received data to a second logic circuit included in a second unit region among the unit regions during the normal mode, and transmitting the received data to the first retention circuit during the sleep mode.

15. The semiconductor device of claim 10, wherein the logic circuit included in a second unit region among the unit regions comprises:
   second logics and second normal flip-flops suitable for operating in synchronization with the first clock; and
   third logics and third normal flip-flops suitable for operating in synchronization with the second clock.

16. The semiconductor device of claim 15, wherein a retention circuit in the second unit region comprises:
   second retention flip-flops suitable for receiving data from the second normal flip-flops in synchronization with the first clock when an operation mode changes from the normal mode to the sleep mode and keeping the data received from the second normal flip-flops; and
   third retention flip-flops suitable for receiving data from the third normal flip-flops in synchronization with the second clock when an operation mode changes from the normal mode to the sleep mode and keeping the data received from the third normal flip-flops.

17. The semiconductor device of claim 16, wherein the second normal flip-flops and the second retention flip-flops form a first scan chain, and
   the third normal flip-flops and the third retention flip-flops form a second scan chain.

* * * * *